(12) United States Patent
Ata et al.

(10) Patent No.: US 10,529,369 B2
(45) Date of Patent: Jan. 7, 2020

(54) DISPLAY DEVICE

(71) Applicant: Mitsubishi Electric Corporation, Tokyo (JP)

(72) Inventors: Daiki Ata, Tokyo (JP); Kazuhiko Nakamura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/327,864

(22) PCT Filed: Oct. 18, 2016

(86) PCT No.: PCT/JP2016/080828
§ 371 (c)(1),
(2) Date: Feb. 25, 2019

(87) PCT Pub. No.: WO2018/073889
PCT Pub. Date: Apr. 26, 2018

(65) Prior Publication Data
US 2019/0341073 A1    Nov. 7, 2019

(51) Int. Cl.
*G11B 7/126* (2012.01)
*G01B 11/10* (2006.01)
(Continued)

(52) U.S. Cl.
CPC .............. *G11B 7/126* (2013.01); *G01B 11/10* (2013.01); *G11B 7/127* (2013.01); *H01S 5/042* (2013.01)

(58) Field of Classification Search
CPC ......... G11B 7/126; G11B 7/127; H01S 5/042; G01B 11/10
See application file for complete search history.

(56) References Cited

U.S. PATENT DOCUMENTS 5,675,561 A * 10/1997 Yoshioka ............. G11B 7/0946
369/44.25
2009/0225327 A1    9/2009 Maeda
(Continued)

FOREIGN PATENT DOCUMENTS

JP    H02-254864 A    10/1990
JP    H07-146113 A    6/1995
(Continued)

OTHER PUBLICATIONS

Decision to Grant a Patent received for Japanese Patent Application No. 2017-561016, dated Dec. 22, 6 pages including English Translation.
(Continued)

*Primary Examiner* — Xinning (Tom) Niu
(74) *Attorney, Agent, or Firm* — XSENSUS LLP

(57) ABSTRACT

A peak location calculation device includes a peak value detection block that detects a plurality of candidates for a peak value of intensity of laser light received by an imaging unit consisting of an imaging element formed of a plurality of pixels, and a peak location calculation block that calculates an approximation function that approximates an intensity distribution of the laser light using the plurality of candidates for peak values detected by the peak value detection block. The peak location calculation block calculates the approximation function that minimizes an error between intensity values of the plurality of candidates for the peak value and values of the approximation function.

1 Claim, 9 Drawing Sheets

(51) Int. Cl.
*G11B 7/127* (2012.01)
*H01S 5/042* (2006.01)

(56) References Cited

U.S. PATENT DOCUMENTS

2011/0051583 A1    3/2011    Imai
2012/0146561 A1    6/2012    Steinlechner et al.

FOREIGN PATENT DOCUMENTS

| JP | 2004-185391 A | 7/2004 | | |
|----|---------------|--------|---|---|
| JP | 2006-010361 A | 1/2006 | | |
| JP | 2008-281399 A | 11/2008 | | |
| JP | 2009-074814 A | 4/2009 | | |
| JP | 2011-048869 A | 3/2011 | | |
| JP | 2013-502200 A | 1/2013 | | |
| JP | 2013-200246   | * 10/2013 | ............. | G11B 11/10 |
| JP | 2013-200246 A | 10/2013 | | |

OTHER PUBLICATIONS

International Search Report dated Jan. 17, 2017 for PCT/JP2016/080828 filed on Oct. 18, 2016, 13 pages including English Translation.

* cited by examiner

FIG.9

NUMBER OF DATA POINTS

| ORDER | 1 | 2 | 3 | 4 | 5 | 6 | 7 | |
|---|---|---|---|---|---|---|---|---|
| 0 | c00 | c01 | c02 | c03 | c04 | | | COEFFICIENTS FOR: QUADRATIC, 5 DATA POINTS, WEIGHT OF 1 |
| 1 | c10 | c11 | c12 | c13 | c14 | | | |
| 2 | c20 | c21 | c22 | c23 | c24 | | | |
| 0 | c00 | c01 | c02 | c03 | c04 | | | COEFFICIENTS FOR: QUADRATIC, 5 DATA POINTS, WEIGHT OF 12421 |
| 1 | c10 | c11 | c12 | c13 | c14 | | | |
| 2 | c20 | c21 | c22 | c23 | c24 | | | |
| 0 | c00 | c01 | c02 | c03 | c04 | c04 | c04 | COEFFICIENTS FOR: QUADRATIC, 7 DATA POINTS, WEIGHT OF 1 |
| 1 | c10 | c11 | c12 | c13 | c14 | c14 | c14 | |
| 2 | c20 | c21 | c22 | c23 | c24 | c24 | c24 | |
| 0 | c00 | c01 | c02 | c03 | c04 | c04 | c04 | COEFFICIENTS FOR: QUADRATIC, 7 DATA POINTS, WEIGHT OF 1234321 |
| 1 | c10 | c11 | c12 | c13 | c14 | c14 | c14 | |
| 2 | c20 | c21 | c22 | c23 | c24 | c24 | c24 | |
| 0 | c00 | c01 | c02 | c03 | c04 | c04 | c04 | COEFFICIENTS FOR: CUBIC, 7 DATA POINTS, WEIGHT OF 1 |
| 1 | c10 | c11 | c12 | c13 | c14 | c14 | c14 | |
| 2 | c20 | c21 | c22 | c23 | c24 | c24 | c24 | |
| 3 | c30 | c31 | c32 | c33 | c34 | c34 | c34 | |
| 0 | c00 | c01 | c02 | c03 | c04 | c04 | c04 | COEFFICIENTS FOR: CUBIC, 7 DATA POINTS, WEIGHT OF 1234321 |
| 1 | c10 | c11 | c12 | c13 | c14 | c14 | c14 | |
| 2 | c20 | c21 | c22 | c23 | c24 | c24 | c24 | |
| 3 | c30 | c31 | c32 | c33 | c34 | c34 | c34 | |

DISPLAY DEVICE

CROSS-REFERENCE TO RELATED APPLICATION

The present application is based on PCT filing PCT/JP2016/080828, filed Oct. 18, 2016, the entire contents of which are incorporated herein by reference.

FIELD

The present invention relates to a peak location calculation device and a display device applicable to a measurement apparatus for measuring an amount of displacement between a sensor and a detection target.

BACKGROUND

To calculate the amount of displacement of a detection target, a laser displacement sensor device conventionally calculates a weighted center of ht quantity of a received-light intensity distribution, and thus determines the peak location.

Patent Literature 1, providing a conventional technology, discloses an optical displacement meter with an object of providing an optical displacement meter adapted for faster measurement speed while retaining advantages in providing feedback control of the amount of light emitted from a light-emitting element and of the amplification factor of an amplifier; and the optical displacement meter includes a light-emitting element to emit light to a target, an image sensor to receive light from the target and to generate an image signal, a signal processing circuit including an amplifier that amplifies the image signal from the image sensor, and a control unit to provide feedback control of at least one of amounts of operation including an amount of light emitted from the light-emitting element and an amplification factor of the amplifier, based on the image signal from the signal processing circuit, where the at least one of the amounts of operation in the feedback control has a variable range that is configurable, and the control unit sets, in a variable range configuration mode, an appropriate variable range for the amount of operation, based on data on the amount of operation for a predetermined time period.

CITATION LIST

Patent Literature

Patent Literature 1: Japanese Patent Application Laid-open No. 2006-10361

SUMMARY

Technical Problem

A method of calculating a peak location simply using the weighted center of a received-light intensity distribution of reflected light as done in a conventional laser displacement sensor device presents a problem in limited applicability to a device requiring higher detection accuracy.

The present invention has been made in view of the foregoing, and it is an object of the present invention to provide a peak location calculation device capable of calculating the peak location in a received-light intensity distribution of reflected light with high accuracy.

Solution to Problem

To solve the problem and achieve the object described above, a peak location calculation device according to the present invention includes a peak value detection block to detect a plurality of candidates for a peak value of intensity of laser light received by an imaging unit consisting of an imaging element formed of a plurality of pixels, and a peak location calculation block to calculate an approximation function that approximates an intensity distribution of the laser light using the plurality of candidates for the peak value detected by the peak value detection block. The peak location calculation block calculates the approximation function that minimizes an error between intensity values of the plurality of candidates for the peak value and values of the approximation function.

Advantageous Effects of Invention

A peak location calculation device according to the present invention provides an advantage in being capable of calculating the peak location in a received-light intensity distribution of reflected light with high accuracy.

BRIEF DESCRIPTION OF DRAWINGS

FIG. 9 is a chart illustrating example parameter values each at a weight of 1.

DESCRIPTION OF EMBODIMENTS

A peak location calculation device and a display device according to an embodiment of the present invention will be described in detail below with reference to the drawings. Note that the embodiment is not intended to limit the scope of this invention.

EMBODIMENT

Figure 1:
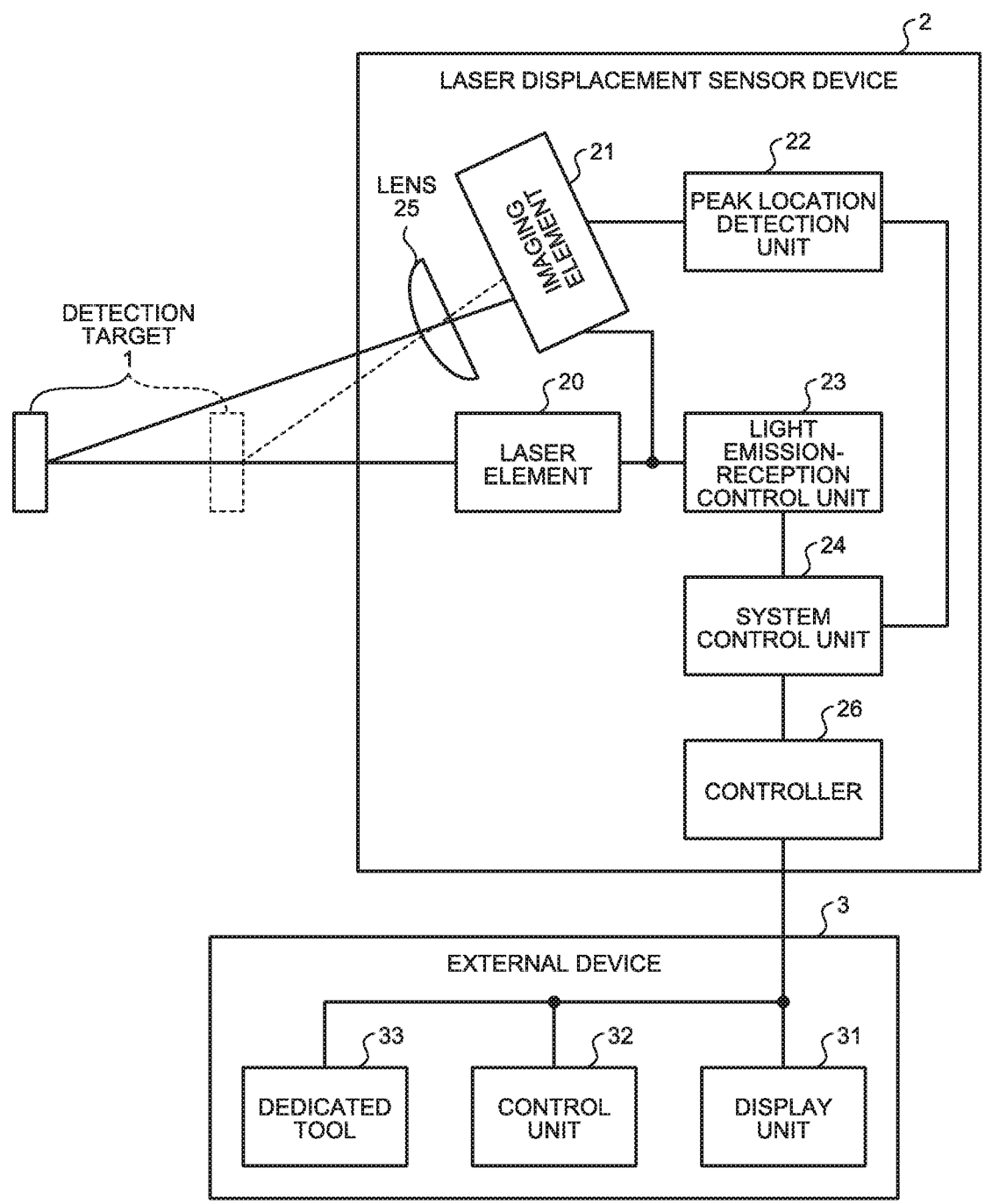
FIG. 1 is a diagram illustrating an example of the configuration of a set including a laser displacement sensor device including a peak location calculation unit, which is a peak location calculation device according to an embodiment, a detection target, and an external device.

FIG. 1 is a diagram illustrating an example of the configuration of a set including a laser displacement sensor device 2 including a peak location calculation block 224, which is a peak location calculation device according to the embodiment of the present invention, a detection target 1, and an external device 3. The laser displacement sensor device 2 and the external device 3 communicate with each other via a network, thereby enabling data to be shared, including parameters for use in peak location calculation.

The laser displacement sensor device 2 includes a laser element 20, an imaging element 21, the peak location detection unit 22, a light emission-reception control unit 23, a system control unit 24, a lens 25, and a controller 26. The laser displacement sensor device 2 emits laser light from the laser element 20 to the detection target 1, receives reflected light from the detection target 1 through the lens 25 using the imaging element 21, and converts the peak location of received-light intensity in a received-lights intensity distribution into an amount of displacement thus to measure the distance. A distance is measured herein by triangulation ranging that measures an amount of displacement based on a reflection angle with respect to an incident angle of laser light reflected by the detection target 1

The laser element 20 is a source of radiation of the laser light emitted to the detection target 1. The imaging element 21 is a digital imaging element that receives reflected light from the detection target 1. The laser displacement sensor device 2 includes an imaging unit (not illustrated) including the imaging element 21 formed of multiple pixels. The peak location detection unit 22 detects the peak location of a received-light intensity distribution obtained from the imaging element 21. The light emission-reception control unit 23 controls light emission from the laser element 20 and light reception on the imaging element 21. The laser displacement sensor device 2 and the external device 3 together form a laser displacement sensor system, and the system control unit 24 controls this laser displacement sensor system. The lens 25 is disposed between the detection target 1 and the imaging element 21 to collect reflected light from the detection target 1. The controller 26 is a laser displacement sensor controller. The controller 26 outputs an operation result of the controller 26 to a personal computer (PC) (not illustrated) or a programmable logic controller (PLC) (not illustrated), or to the external device 3.

The external device 3 includes a display unit 31, a control unit 32, and a dedicated tool 33. The external device 3 is connected to the laser displacement sensor device 2 via a communication facility such as a network. The display unit 31 is an input-output interface, and is a display operation unit having functions to display information needed by a user, and to allow a user operation to be input. Examples of the information needed by a user include a high-order function curve for parameter configuration, which may herein be selected for use. The control unit 32 controls the external device 3, and outputs a configured parameter to the system control unit 24 through external configuration or automatic configuration. One example of the control unit 32 is a PLC. The control unit 32 may also have a function to simulate how a parameter output to the system control unit 24 will be reflected on the high-order function curve displayed on the display unit 31. The dedicated tool 33 is a tool for parameter configuration and output configuration. The external device 3 may also be regarded as a display device including the display unit 31.

Figure 2:
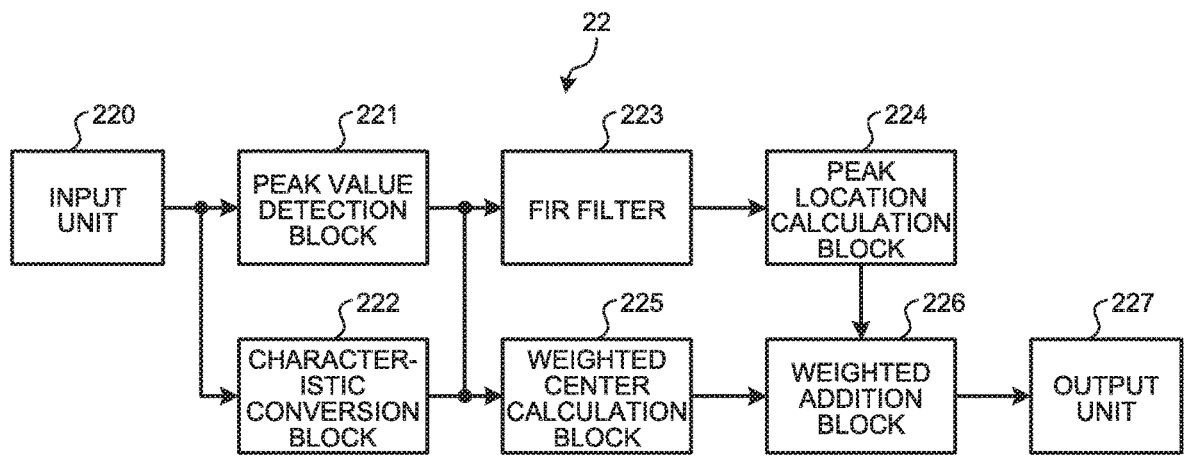
FIG. 2 is a diagram illustrating an example of the configuration of the peak location detection unit illustrated in FIG. 1.

FIG. 2 is a diagram illustrating an example of the configuration of the peak location detection unit 22 illustrated in FIG. 1. The peak location detection unit 22 illustrated in FIG. 2 includes an input unit 220, a peak value detection block 221, a characteristic conversion block 222, a finite impulse response (FIR) filter 223, a peak location calculation block 224, a weighted center calculation block 225, a weighted addition block 226, and an output unit 227. The input unit 220 is an input unit that receives data of the received-light intensity distribution from the imaging element 21. The peak value detection block 221 detects an approximate peak location of a waveform curve of the received-light intensity distribution from the imaging unit formed of the imaging element 21, depending on the value of the parameter configured. The characteristic conversion block 222 performs gamma conversion or logarithmic conversion on data of the received-light intensity distribution from the imaging element 21. The FIR filter 223 approximates the waveform curve of the received-light intensity distribution whose approximate peak location has been detected by the peak value detection block 221, or the narrow-width waveform curve generated by the characteristic conversion block 222, by a high-order function curve using a least squares method. Note that the approximation method is not limited to a method using an FIR filter, but as long as a high-order function can be generated, approximation may also be performed using a general least squares method although this operation takes a long time. The peak location calculation block 224 calculates the peak location from the curve of the approximation function, i.e., the high-order function curve generated through approximation by the FIR filter 223. Note that the peak location calculation block 224 may include the FIR filter 223. In the embodiment, the curve of the approximation function is calculated over a range around the approximate peak location detected by the peak value detection block 221. This also applies to the case of calculation of the curve of the approximation function using the output of the characteristic conversion block 222. The weighted center calculation block 225 calculates, as the peak location, the weighted center of a range around the approximate peak location detected by the peak value detection block 221, or of the entire range or a certain section, of the waveform curve of the received-light intensity distribution; or the weighted center of the narrow-width waveform curve generated by the characteristic conversion block 222, depending on the value of the parameter configured. The output unit 227 outputs the peak location calculated by the peak location calculation block 224 or by weighted addition block 226. In the embodiment, the peak location is calculated so as to minimize the error between intensity values of multiple candidates for the peak value and values of the approximation function curve. The peak location output by the output unit 227 is input to the system control unit 24.

Figure 3:
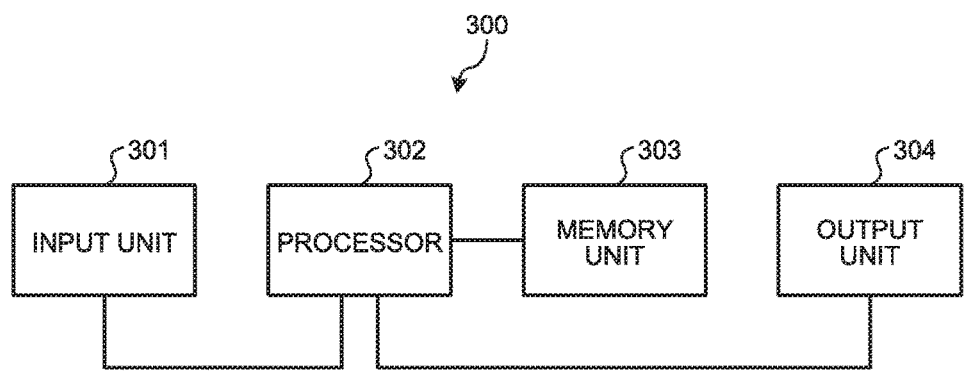
FIG. 3 is a diagram illustrating an example of a typical configuration of hardware that implements the peak location detection unit illustrated in FIG. 2.

The peak location detection unit 22 includes, at least, a processor, a memory unit, an input unit, and an output unit. The operations of the components included in the peak location detection unit 22 may be implemented in software. FIG. 3 is a diagram illustrating an example of a typical configuration of hardware that implements the peak location detection unit 22 illustrated in FIG. 2. The hardware 300 illustrated in FIG. 3 includes an input unit 301, a processor 302, a memory unit 303, and an output unit 304. The processor 302 provides operations and control by software using input data. The memory unit 303 stores received data, or data and software required for the processor 302 to provide operations and control. The peak value detection block 221, the characteristic conversion block 222, the FIR filter 223, the peak location calculation block 224, the weighted center calculation block 225, and the weighted addition block 226 are implemented in the processor 302 and the memory unit 303. The input unit 301 corresponds to the input unit 220 illustrated in FIG. 2, and is a data input interface. The output unit 304 corresponds to the output unit 227 illustrated in FIG. 2, and is a data output interface. The hardware 300 may include multiple input units 301, multiple processors 302 multiple memory units 303, and multiple output units 304.

Figure 4:
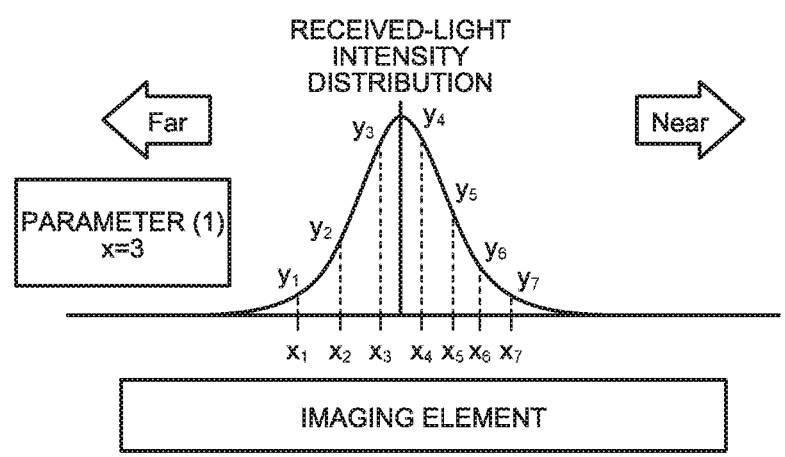
FIG. 4 is a diagram for describing the peak value detection block illustrated in FIG. 2.

FIG. 4 is a diagram for describing the peak value detection block 221 illustrated in FIG. 2. Firstly, the peak value detection block 221 detects a location corresponding to a high light quantity in an approximate manner. Then, the peak value detection block 221 obtains the value of a configured parameter from the external device 3. Since the chart of FIG. 4 assumes that the parameter x has a value of 3, there are three points defined on each of "Far" side and "Near" side about a location $x_4$ corresponding to the maximum received-light intensity. That is, locations $x_1$, $x_2$, and $x_3$ are defined on "Far" side, and locations $x_5$, $x_6$, and $x_7$ are defined on "Near" side, with respect to the location $x_4$.

Figure 5:
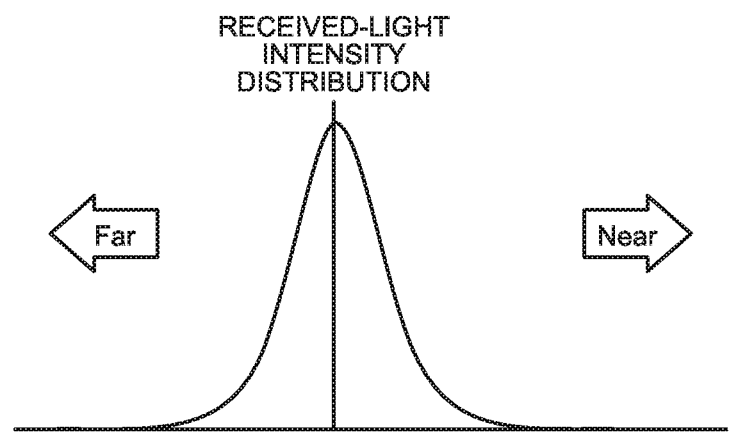
FIG. 5 is a diagram illustrating a waveform curve Generated from a received-light intensity distribution input to the characteristic conversion block illustrated in FIG. 2.
Figure 6:
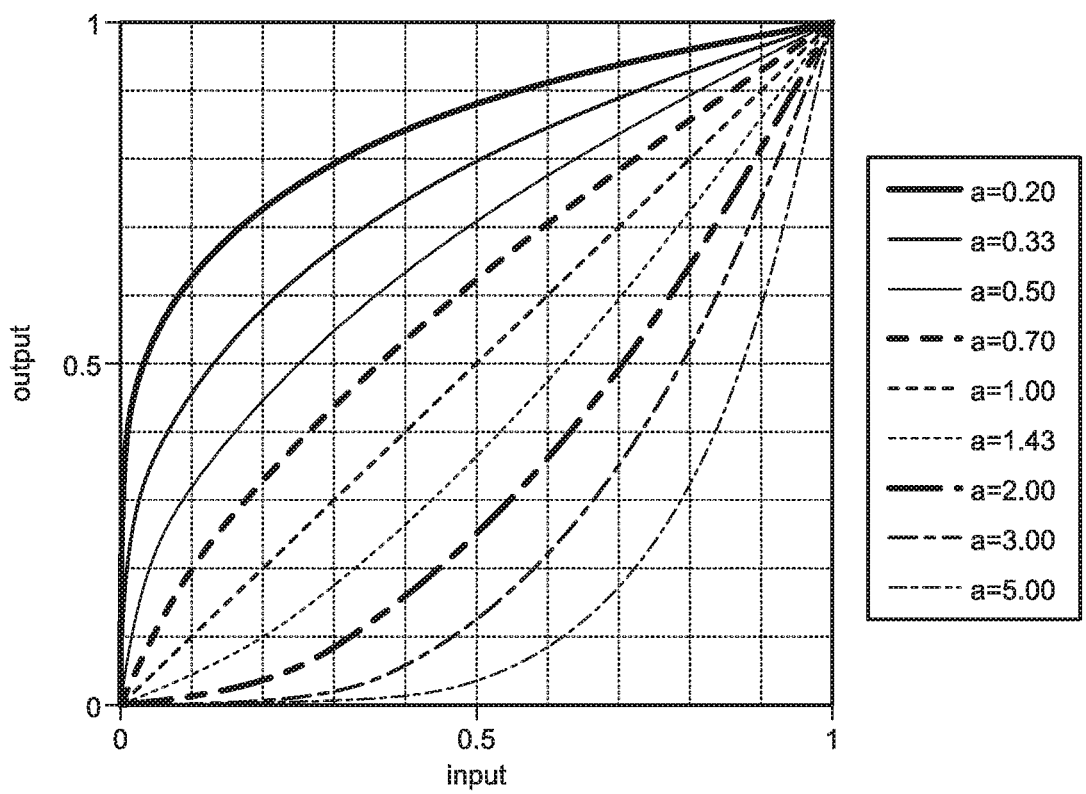
FIG. 6 is a diagram illustrating gamma conversion.
Figure 7:
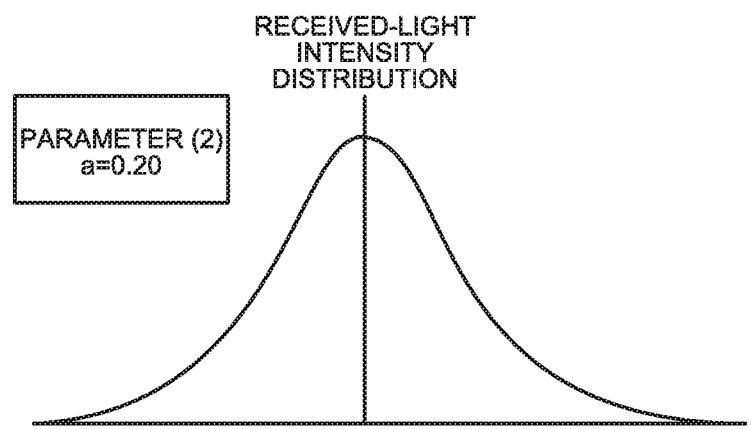
FIG. 7 a diagram illustrating a waveform curve at a gamma value of a=0.20.
Figure 8:
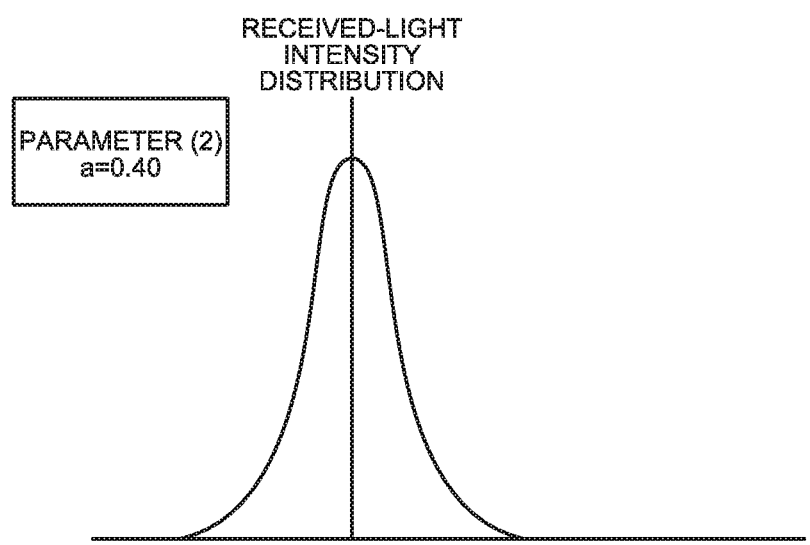
FIG. 8 a diagram illustrating a waveform curve at a gamma value of a=0.40.

FIG. 5 is a diagram. illustrating a waveform curve generated from the received-light intensity distribution input to the characteristic conversion block 222 illustrated in FIG. 2. FIG. 6 is a diagram illustrating gamma conversion. FIG. 6 illustrates relationships between values along the horizontal axis X representing input values and values along the vertical axis Y representing output values at gamma values of a=0.20, 0.33, 0.50, 0.70, 1.00, 1.43, 2.00, 3.00, and 5.00. FIG. 7 is a diagram. illustrating a waveform curve at a gamma value of a=0.20, and FIG. 8 is a diagram illustrating a waveform curve at a gamma value of a=0.40. Gamma conversion in the characteristic conversion block 222 broadens the upper portion of the peaked shape of the waveform curve at a gamma value of a<1, and narrows the lower portion of the peaked shape of the waveform curve at a gamma value of 1<a. Gamma conversion corrects nonlinearity in the input-output characteristic, thereby enabling an expected, accurate input intensity to be obtained from an intensity output value. Similarly, use of logarithmic conversion instead of gamma conversion also enables an expected, accurate input intensity to be obtained. Gamma conversion is performed to change which of the center portion of the peaked shape and the tails of the peaked shape is to be given priority upon brightness correction or peak calculation. Logarithmic conversion is performed when emission and diffusion of light is to be considered, and is performed for coefficient calculation. Sequentially performing logarithmic conversion and a least squares method enables a peak to be more accurately calculated.

An operation of the FIR filter 223 will next be described. The FIR filter 223 uses a least squares method to calculate coefficients of an nth-order function from an input waveform curve. The example below describes calculation of coefficients for a case of n=2, that is, for a quadratic function given by Formula 1 below.

[Formula 1]

$$y_i = a_0 + a_1 x_i + a_2 x_i^2 \quad (1)$$

The coefficients $a_1$ and $a_2$ in Formula 1 above are calculated by Formula 2 below.

[Formula 2]

$$\begin{bmatrix} a_0 \\ a_1 \\ a_2 \end{bmatrix} = \begin{bmatrix} C_{00} & C_{01} & C_{02} & C_{03} & C_{04} \\ C_{10} & C_{11} & C_{12} & C_{13} & C_{14} \\ C_{20} & C_{21} & C_{22} & C_{23} & C_{24} \end{bmatrix} \begin{bmatrix} y_0 \\ y_1 \\ y_2 \\ y_3 \\ y_4 \end{bmatrix} \quad (2)$$

Refer to FIG. 9, which is a chart illustrating example parameter values each at a weight of 1.

As illustrated, storing in the controller 26, or inputting from the external device 3, parameter values dependent on the weights in a form of a look-up table enables the coefficients $a_1$ and $a_2$ in Formula 1 above to be quickly calculated to approximate a received-light intensity distribution by a quadratic function. In addition, calculation of only the weighted center can also produce an accurate peak location.

An operation of the peak location calculation block 224 will next be described. The peak location calculation block 224 differentiates the quadratic function generated as described above with respect to x. Differentiation of the quadratic function generated as described above with respect to x yields Formula 3 below.

[Formula 3]

$$y'_i = a_1 + 2a_2 x_i \quad (3)$$

At the peak location, the slope becomes 0, which then results in $y_i' = 0$. Thus, the peak location $x_{peak}$ can be represented as Formula 4 below.

[Formula 4]

$$x_{peak} = -\frac{a_1}{2a_2} \quad (4)$$

Figure 10:
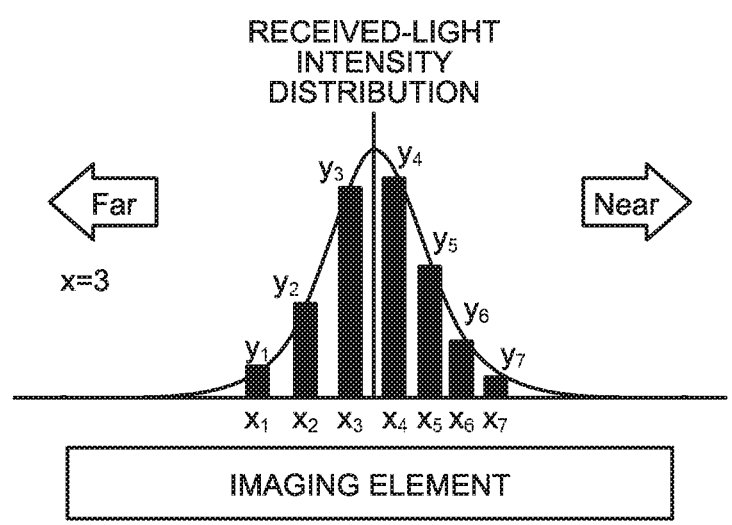
FIG. 10 is a diagram for describing an operation of calculation of the weighted center performed in the weighted center calculation block illustrated in FIG. 2.

An operation of the weighted center calculation block 225 will next be described. FIG. 10 is a diagram for describing an operation of calculation of the weighted center performed in the weighted center calculation block 225 illustrated in FIG. 2. The description below describes an operation of calculation of the weighted center from the received-light intensity distribution that has been used in the peak value detection block 221. For the distribution of FIG. 10, the weighted center is represented by Formula 5 below.

[Formula 5]

$$\frac{\Sigma x_i y_i}{\Sigma y_i} \quad (5)$$

In this operation, to focus on data near the peak and to avoid using tail data, the locations $x_1$ and $x_7$ farthest from the location $x_4$ are discarded. Then, the location of the weighted center in FIG. 10 is represented as Formula 6 below. The weighted center calculation block 225 may calculate this location as the peak location, or alternatively, may use more data to calculate the weighted center location over the entire region.

[Formula 6]

(Location of weighted center)=

$$(x_2 y_2 + x_3 y_3 + x_4 y_4 + x_5 y_5 + x_6 y_6)/(y_2 + y_3 + y_4 + y_5 + y_6) \quad (6)$$

The components included in the peak location detection unit 22 operate as described above. In a case in which the peak location is calculated through peak detection in the peak value detection block 221, a method can be used that includes approximating, by an nth-order function, the received-light intensity distribution whose peak has been detected, using a least squares method in the FIR filter 223, and calculating the location at which the slope of this nth-order function becomes 0 as the peak location in the peak location calculation block 224; and a method can be used that includes calculating the weighted center of the received-light intensity distribution whose peak has been detected as the peak location in the weighted center calculation block 225. Otherwise, in a case in which the peak location is calculated through characteristic conversion in the characteristic conversion block 222, a method can be used that includes approximating, by an nth-order function, the received-light intensity distribution whose characteristic has been converted, using a least squares method in the FIR filter 223, and calculating the location at which the slope of this nth-order function becomes 0 as the peak location in the peak location calculation block 224; and a method can be used that includes calculating the weighted center of the received-light intensity distribution whose characteristic has been converted as the peak location in the weighted center calculation block 225.

Figure 11:
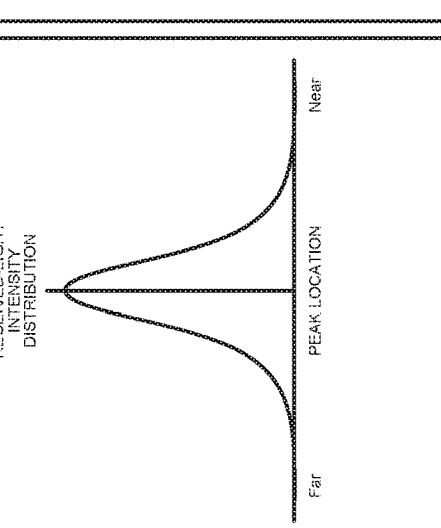
FIG. 11 is a diagram illustrating a first screen example of parameter configuration screen displayed on the display unit illustrated in FIG. 1.
Figure 12:
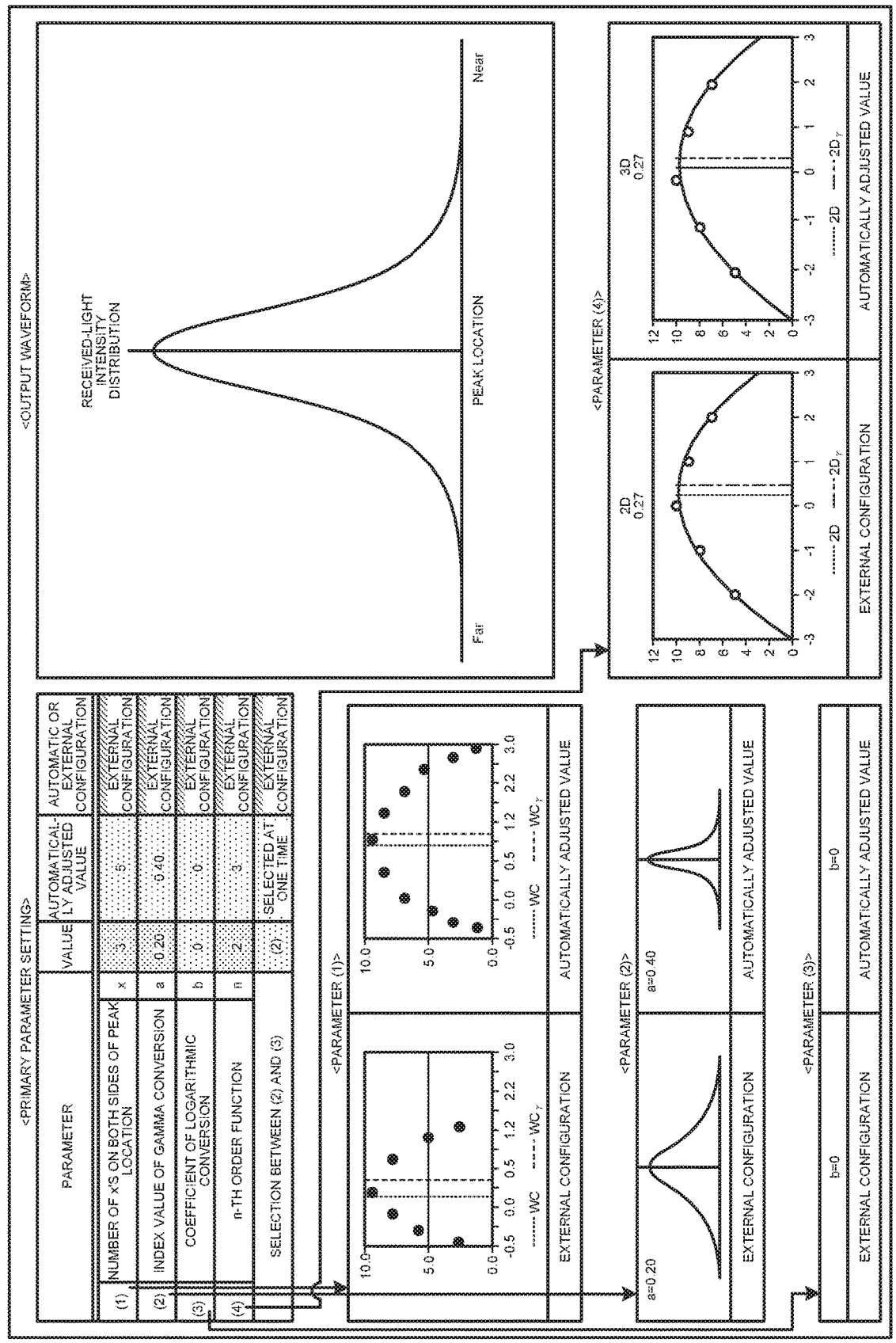
FIG. 12 is a diagram illustrating a second screen example of parameter configuration screen displayed on the display unit illustrated in FIG. 1.

FIG. 11 is an example configuration screen illustrating a first screen example of parameter configuration screen displayed on the display unit 31 illustrated in FIG. 1. FIG. 12 is an example calculation result screen illustrating a second screen example of parameter configuration screen displayed on the display unit 31 illustrated in FIG. 1. FIG. 11 illustrates a primary parameter table, a secondary parameter table, a table of recipes specifying parameter sets, and an output waveform. A selection by a user of the value column of the primary parameter table causes the display unit 31 to display the second screen example illustrated in FIG. 12. The second screen example illustrates waveform curves, side by side, that use values in the primary parameter table as the parameter values, and that use automatically adjusted values as the parameter values, for each of the number of x's on both sides of the peak location, the gamma value a, i.e., the index value of gamma conversion, and the value n of the nth-order function, which belong to the primary parameters. That is, the left part of the parameter (1) section illustrates a waveform curve for the number of x's on both sides of the peak location being 3, and the right part of the parameter (1) section illustrates a waveform curve for the number of x's on both sides of the peak location being an automatically adjusted value of 5. Note that gamma conversion associated with the parameter (2) and logarithmic conversion associated with the parameter (3) are algorithms of alternative options. The left part of the parameter (2) section illustrates a waveform curve at a gamma value, i.e., an index value of gamma conversion, being a=0.20, while the right part of the parameter (2) section illustrates a waveform curve at a gamma value a, i.e., an index value of gamma conversion, being an automatically adjusted. value of a=0.40. Although the parameter (3) is not selected in this example, selection of the parameter (3) will cause the left part of the parameter (3) section to illustrate a waveform curve for the index value of logarithmic conversion, and the right part of the parameter (3) section to illustrate a waveform. curve for an index value of logarithmic conversion being an automatically adjusted. value, instead. of the waveform curves associated with the parameter (2). The left part of the parameter (4) section illustrates a waveform curve for a generated curve representing a quadratic function, while the right part of the parameter (4) section illustrates a waveform curve for a generated curve representing a cubic function. The secondary parameter section in the lower part of FIG. 11 is a window for configuring addition coefficients associated with respective peak values calculated using the primary parameter values. An example is illustrated where modes 1 to 6 only use the calculated peaks, while modes 7 to 10 multiply the values by coefficients to calculate an additional average.

The user can also change and configure an automatically adjusted value depending on a characteristic of the detection target 1 using a result of a primary parameter, in the secondary parameter table illustrated in FIG. 11. The first configuration screen example illustrated in FIG. 11 and the second calculation result screen example illustrated in FIG. 12 work cooperatively, and therefore, a change in one of these is reflected in the other. That is, changing the value of the parameter (1) of the primary parameters to n=3 in FIG. 11 results in a change in the value of the parameter (4) of the primary parameters to n=3 also in FIG. 12.

The user can also select one of recipes A, B, and C illustrated in FIG. 11. As an example, selection of recipe A causes the lower limit of the amount of displacement to be set to mode 1, and the upper limit of the amount of displacement to be set to mode 7. In mode 1, the calculated value for 2D of "peak detection→least squares method" is 0.16, when the coefficient therefor is 1.00, and the other coefficients are 0. Thus, the sum of the products of the calculated values and the coefficients, i.e., 0.16, is the peak location. In mode 7, the coefficient for 2D and the coefficient for 3D of "peak detection→least squares method" are respectively 0.20 and 0.35, the coefficient for WC of "peak detection→weighted center calculation" is 0.00, the coefficient for $2D_\gamma$ and the coefficient for $3D_\gamma$ of "characteristic conversion→least squares method." are respectively 0.10 and 0.25, and the coefficient for $WC_\gamma$ of "characteristic conversion→weighted center calculation" is 1.10. The calculated value for 2D and the calculated value for 3D of "peak detection→least squares method" are respectively 0.16 and 0.55, the calculated value for WC of "peak detection weighted center calculation" is 0.22, the calculated value for $2D_\gamma$ and the calculated value for $3D_\gamma$ of "characteristic conversion→least squares method" are respectively 0.23 and 0.62, and the calculated value for $WC_\gamma$ of "characteristic conversion→weighted center calculation" is 0.29. Thus, the sum of the products of these coefficients and calculated values, i.e., 0.43, is the peak location. Note that the peak location can also be calculated for output-adjusted values and automatically adjusted values when no recipe is selected. In the present embodiment, selection of a recipe also enables a mode having a different set of parameter values to be set and selected. If recipe A is selected, a measurement value beyond the selected range corresponding to modes 1 to 7 causes "NG: 0" to be output, and a measurement value within this range causes "OK: 1" to be output. Alternatively, a value that is set for the measurement range may be used as the upper or lower limit for outputting to the PLC, and these values may be written in a memory or in a register of the PLC.

A change in any of the primary parameters, the secondary parameter, and the recipe selection is reflected in the output waveforms in FIGS. 11 and 12, thereby enabling the user to adjust a parameter value while observing the output waveforms.

As described above, use of characteristic conversion can improve the accuracy of peak location calculation to reach about 1/50 to 1/20 of the pixel interval. Use of a least squares method can improve the accuracy of peak location calculation to reach about $1/100$ of the pixel interval.

In addition, a peak location calculation device according to the present invention can optimize computational processing and conversion processing based on the surface condition including gloss of the detection target 1, and can thus correct for disturbance to calculate the peak location with high accuracy. The use of an FIR filter enables the peak location to be calculated with higher accuracy. This is because a least squares method is highly effective for a highly disturbed or noisy condition, and calculation using information on a periphery of the peak is advantageous for a glossy surface due to saturation in an upper portion at the peak. Iteration of the processing may improve the accuracy.

Note that a configuration that allows parameter configuration to be performed while parameter values are displayed on the display unit improves operability in parameter configuration and adjustment operations.

The use of a recipe as described above enables determination of whether the calculated amount of displacement falls within the range from an upper limit to a lower limit of amount of displacement. This enables determination of whether the amount of displacement in a small region meets a reference value that has been set, thereby enabling quality control of the detection target.

Although the foregoing description assumes that all of the result from the process "peak detection→least squares method", the result from the process "characteristic conversion→least squares method", and the result from the process "characteristic conversion→weighted center calculation" are used, the operation of the present invention is not limited thereto, but use of at least one of these results is sufficient. In addition to these results, a result from a process "peak detection→weighted center calculation" may also be used in combination.

Although the foregoing description assumes that the least squares method is performed in the FIR filter, the operation of the present invention is not limited thereto. A least squares method is generally performed by calculating an inverse matrix through a matrix operation to calculate coefficients. This method takes more time than a method using an FIR.

The configurations described in the foregoing embodiment are merely examples of various aspects of the present invention. These configurations may be combined with a known other technology, and moreover, a part of such configurations may be omitted and/or modified without departing from the spirit of the present invention.

REFERENCE SIGNS LIST

1 detection target; 2 laser displacement sensor device; 3 external device; 20 laser element; 21 imaging element; 22 peak location. detection unit; 23 light emission-reception control unit; 24 system control unit; lens; 26 controller; 31 display unit; 32 control unit; 33 dedicated tool; 220 input unit; 221 peak value detection block; 222 characteristic conversion block; 223 FIR filter; 224 peak location calculation block; 225 weighted center calculation block; 226 weighted addition block; 227 output unit; 300 hardware; 301 input unit; 302 processor; 303 memory unit; 304 output unit.

The invention claimed is:

1. A display connectable to a peak location calculation device, the peak location calculation device including:
   peak value detection circuitry to detect a plurality of candidates for a peak value of intensity of laser light received by an imaging unit consisting of an imaging element formed of a plurality of pixels, and
   peak location calculation circuitry to calculate an approximation function that approximates an intensity distribution of the laser light using the plurality of candidates for the peak value detected by the peak value detection circuitry,
   wherein the peak location calculation circuitry calculates the approximation function that minimizes an error between intensity values of the plurality of candidates for the peak value and values of the approximation function,
   wherein
   the display further includes circuitry configured to calculate a weighted average of a plurality of peak locations calculated by the peak location calculation circuitry, using a weighting factor set associated with one mode of a plurality of modes, the one mode determined based on an operation performed on an operation screen, to calculate and display a peak location.

* * * * *